United States Patent
Ong et al.

(10) Patent No.: US 9,805,775 B1
(45) Date of Patent: Oct. 31, 2017

(54) INTEGRATED CIRCUITS WITH IMPROVED MEMORY CONTROLLERS

(71) Applicant: Altera Corporation, San Jose, CA (US)

(72) Inventors: Yu Ying Ong, Ampang (MY); Weizhong Xu, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 271 days.

(21) Appl. No.: 14/075,940

(22) Filed: Nov. 8, 2013

(51) Int. Cl.
*G11C 7/22* (2006.01)

(52) U.S. Cl.
CPC .................. *G11C 7/22* (2013.01)

(58) Field of Classification Search
CPC .............. G06F 11/3466; G06F 11/348; G06F 13/3625; G06F 13/4031; G06F 13/4022; G06F 11/0724; G06F 11/0757; G06F 11/2242; G06F 12/0638; G06F 13/124; G06F 13/128; G06F 13/14; G06F 13/22; G06F 13/28; G06F 13/362; G06F 13/385; G06F 15/177; G06F 2003/0697; G06F 3/0601; G06F 13/1605; G06F 13/161; G06F 13/4243; G06F 2003/0698; G06F 3/0611; G06F 9/30047; G11C 11/4076; G11C 7/22; G11C 11/406; G11C 11/40615; G11C 11/40618; G11C 2211/4061; G11C 7/1006
See application file for complete search history.

(56) References Cited

U.S. PATENT DOCUMENTS

| | | | | |
|---|---|---|---|---|
| 5,598,542 A * | 1/1997 | Leung | .................. | G06F 13/3625 710/117 |
| 6,230,245 B1 * | 5/2001 | Manning | ............. | G11C 11/4076 365/230.01 |
| 6,233,531 B1 * | 5/2001 | Klassen | .............. | G06F 11/3466 702/180 |
| 7,624,244 B2 | 11/2009 | Yung et al. | | |
| 7,979,616 B2 * | 7/2011 | Bravo | .................. | G06F 13/1684 710/107 |
| 8,041,990 B2 | 10/2011 | O'Connor et al. | | |
| 2010/0005206 A1 * | 1/2010 | Hnatko | ............... | G06F 13/4243 710/107 |

FOREIGN PATENT DOCUMENTS

EP     2450798     10/2013

OTHER PUBLICATIONS

Ong et al., U.S. Appl. No. 13/734,512, filed Jan. 4, 2013.

* cited by examiner

*Primary Examiner* — Zhuo Li
(74) *Attorney, Agent, or Firm* — Treyz Law Group, P.C.

(57) ABSTRACT

An integrated circuit may include a memory controller that interfaces with memory that operates using a memory clock signal having repeating memory clock cycles. The memory controller may include controller circuitry that receives memory access requests and generates corresponding memory commands using a controller clock signal having repeating controller clock cycles. The controller circuitry may partition each controller clock cycle into time slots that are associated with respective memory clock cycles. Each generated memory command may require a corresponding number of memory clock cycles to fulfill using the memory. The controller circuitry may assign a time slot to each memory command while preventing conflicts with previously issued memory commands.

11 Claims, 9 Drawing Sheets

INTEGRATED CIRCUITS WITH IMPROVED MEMORY CONTROLLERS

BACKGROUND

Programmable integrated circuits are a type of integrated circuit that can be configured by a user to implement custom logic functions. In a typical scenario, a logic designer uses computer-aided design (CAD) tools to design a custom logic circuit. When the design process is complete, the CAD tools generate configuration data. The configuration data is loaded into a programmable integrated circuit to configure the device to perform desired logic functions.

In a typical system, a programmable integrated circuit, memory devices, and other electronic components are mounted on a printed circuit board. The programmable integrated circuit includes memory interface circuitry that is used to relay data back and forth between the programmable integrated circuit and the memory devices (i.e., the memory interface circuitry is used to read data from and write data into the memory devices).

With each new generation of transistor technology, memory circuits are operated at ever-increasing speeds. However, programmable integrated circuits have been unable to match the increases in clock speeds of memory circuits. For example, double-data-rate random access memory three (DDR3) may operate at 1333 MHz and double-data-rate random access memory four (DDR4) can operate at speeds of 800 MHz to 1600 MHz, whereas programmable integrated circuits may operate at reduced speeds of about 200-400 Mhz. Conventional memory interface circuitry accommodates mismatched system and memory clock signals by implementing so-called quarter rate and half rate conversion techniques in which the memory interface circuitry communicates with on-chip circuitry using a system clock signal that is one-fourth (i.e., quarter rate) or half (i.e., half rate) of the speed of the memory clock. However, conventional quarter rate and half rate memory interface circuitry require predefined mappings between each system clock cycle and a corresponding set of memory clock cycles. For example, a controller command received at a quarter rate system clock cycle is mapped to a predefined set of four memory clock cycles. Such predefined mappings between system and memory clock cycles can reduce flexibility in communications with memory.

SUMMARY

An integrated circuit such as a programmable integrated circuit may include a memory controller that interfaces with memory that operates using a memory clock signal having repeating memory clock cycles. The memory controller may include controller circuitry that receives memory access requests and generates corresponding memory commands using a controller clock signal having repeating controller clock cycles. The controller circuitry may partition each controller clock cycle into time slots that are associated with respective memory clock cycles (e.g., each controller clock cycle may be associated with a set of memory clock cycles). Each generated memory command may require a corresponding number of memory clock cycles to fulfill using the memory. The controller circuitry may assign a time slot dynamically to each memory command based on the number of memory clock cycles required to fulfill a prior memory command. By assigning time slots to each memory command, the same controller circuitry may be able to accommodate various scenarios in which the number of memory clock cycles required to fulfill memory commands is different. For example, the dedicated controller circuitry may be able to handle both DDR3 and DDR4 configurations or may be able to handle multiple DDR4 configurations each associated with a different number of memory clock cycles per memory command (e.g., DDR4 configurations requiring or omitting write CRC data).

The controller circuitry may include a counter that produces a counter value. The counter value may identify an available (unused) memory clock cycle in a current controller clock cycle. For example, the counter value may identify the first available memory clock cycle, thereby reflecting how many memory clock cycles extending into the current controller clock cycle were required to fulfill a prior memory command. Each memory command may be assigned to the respective time slot based on the counter value. The counter value may be incremented in response to processing each memory command and may be reset if no memory command was issued in the previous controller clock cycle. If desired, the counter value may be incremented every controller clock cycle.

The memory controller may include interface circuitry that receives memory commands and time slot assignments from the controller circuitry. The interface circuitry may provide the memory commands to the memory at memory clock cycles determined from the time slot assignments. The interface circuitry may include buffer circuitry such as a first-in-first-out (FIFO) buffer. Each entry of the FIFO buffer may be associated with a time slot and a corresponding memory clock cycle. The controller circuitry may store each command in a time slot associated with the assigned memory clock cycle. The controller circuitry may store no-operation (NOOP) commands in unused time slots.

The integrated circuit may include an additional memory controller that interfaces with additional memory. The memory controllers and memories may be coupled to shared input-output pins that serve as command pins. For example, use of shared command pins while maintaining separate input-output data pins helps to conserve costly input-output pins while accommodating simultaneous use of multiple memories. A first memory controller may serve as a primary controller that receives memory commands and time slot assignments from a secondary memory controller. The primary controller may selectively delay memory commands to prevent conflicts on the shared command pins at any given memory clock cycle. If desired, the controllers may exchange time slot assignment information and each controller may selectively delay memory commands to prevent conflicts.

Further features of the present invention, its nature and various advantages will be more apparent from the accompanying drawings and the following detailed description.

DETAILED DESCRIPTION

Embodiments of the present invention relate to integrated circuits having memory controller circuitry that interfaces with on-chip circuitry at different clock speeds than memory (e.g., external memory) such as random-access memory (RAM). The integrated circuits may be digital signal processors, microprocessors, application specific integrated circuits, or other suitable integrated circuits. These types of integrated circuits that are operable to communicate with system memory can benefit from improved memory controller circuitry designs.

Figure 1:
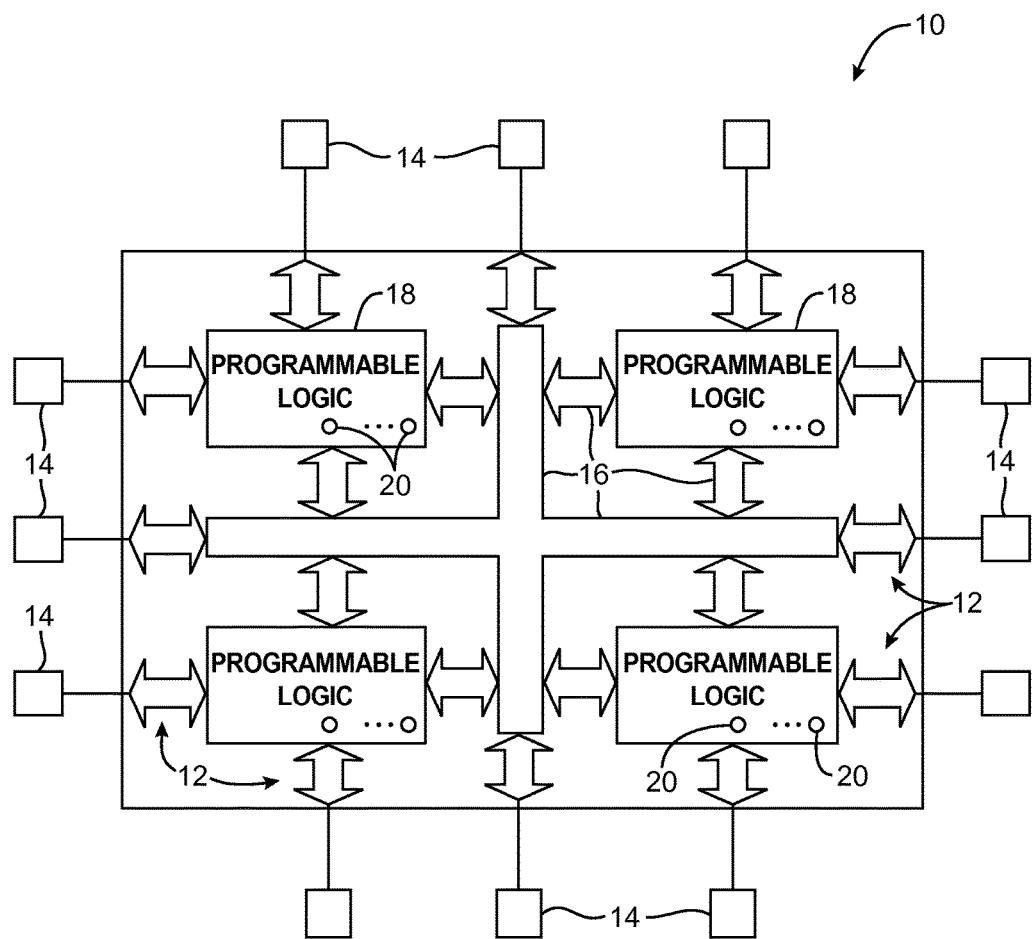
FIG. 1 is a diagram of an illustrative programmable integrated circuit that may include memory controller circuitry in accordance with an embodiment of the present invention.

As an example, an integrated circuit such as a programmable integrated circuit may include memory controller circuitry. This is merely illustrative and does not serve to limit the scope of the present invention. If desired, application specific integrated circuits, microprocessors, and other application specific standard products may contain memory interface circuitry. FIG. 1 shows a diagram of an illustrative programmable integrated circuit device. As shown in FIG. 1, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. For example, programmable logic 18 may include look-up tables, registers, and multiplexers. The programmable logic 18 may be configured to perform a custom logic function. The programmable interconnects associated with interconnection resources may be considered to be a part of programmable logic 18.

Programmable logic 18 contains programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable element 20 may be used to provide a static control output signal for controlling the state of an associated logic component in programmable logic 18. The output signals generated by elements 20 are often applied to gates of metal-oxide-semiconductor (MOS) transistors (sometimes referred to as pass gate transistors). This example is merely illustrative. If desired, programmable elements 20 may be used to provide static output signals for configuring any desired circuitry on device 10.

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 2:
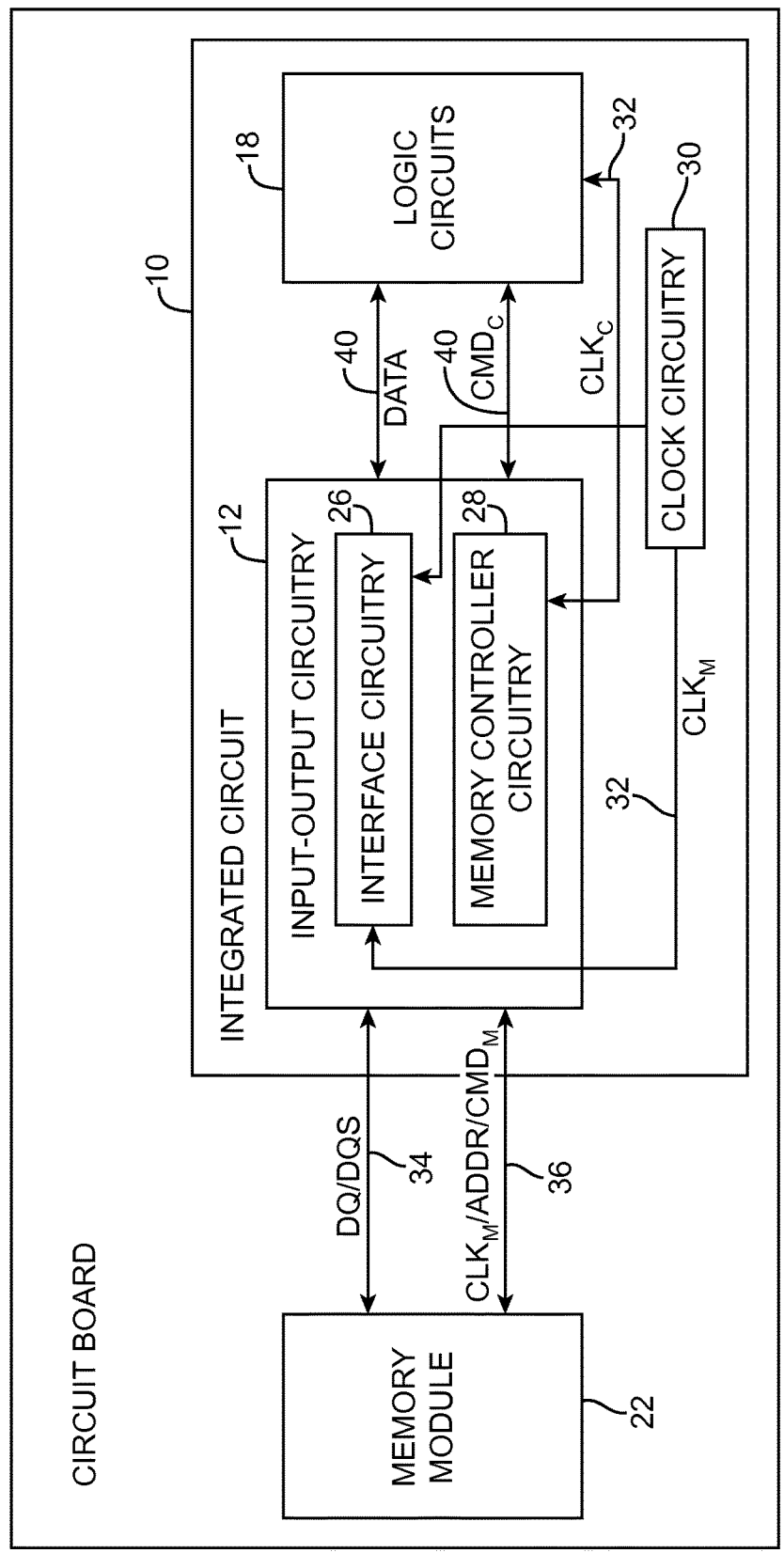
FIG. 2 is a diagram of an illustrative integrated circuit having memory controller circuitry operable to communicate with an external memory module in accordance with an embodiment of the present invention.

Device 10 may communicate with memory such as memory module 22 as shown in FIG. 2. Memory module 22 may be a memory device such as a single in-line memory module (SIMM) or a dual in-line memory module (DIMM). Device 10 may be configured to communicate with at least two memory modules 22, at least four memory modules 22, etc. In the example of FIG. 2, integrated circuit 10, memory module 22, and other circuit components (e.g., integrated circuit chips, surface mount components, etc.) may be mounted on a circuit board 50. Circuit board 50 may, for example, be a rigid printed circuit board (PCB) or other suitable types of printed circuit substrates. Board components may be interconnected through conductive traces and packaging (e.g., sockets into which integrated circuits are mounted) formed on board 50. The example of FIG. 2 in which integrated circuit 10 and memory module 22 are formed as separate components on circuit board 50 is merely illustrative. If desired, integrated circuit 10 and memory module 22 may be formed together as a single component or a single package that may be mounted on circuit board 50. For example, integrated circuit 10 and memory module 22 may be formed as respective integrated circuit die that are stacked to form a single integrated circuit, which may be sometimes referred to as a 3D integrated circuit. In this scenario, paths such as paths 34 and 36 between the integrated circuit die may be formed from through-silicon vias that interconnect integrated circuit 10 and memory module 22 (e.g., vias through a silicon substrate of integrated circuit 10 or memory module 22). As another example, integrated circuit 10 and memory module 22 may each be coupled to an interposer (e.g., to a top surface of the interposer). In this scenario, the interposer may include a substrate and traces on the substrate may form paths 34 and 36 between integrated circuit 10 and memory module 22. The interposer may be mounted to circuit board 50 Arrangements in which two or more integrated circuit die are coupled to an interposer may be sometimes be referred to as 2.5D integrated circuits.

Device 10 may include input-output circuitry 12 that interfaces between device 10 and memory module 22. Input-output circuitry 12 may include memory controller circuitry 28 and interface circuitry 26. Memory controller circuitry 28 may serve to relay information between memory module 22 and logic circuits 18 that are internal to device 10. Read/write data may be conveyed between memory controller circuitry 28 and programmable circuitry 18 via paths 40. Memory controller 28 may be configured to generate appropriate control signals corresponding to the memory protocol currently under use (e.g., circuit 28 may handle memory data management to address desired banks, rows, and columns and to perform memory refresh). The example of FIG. 2 in which input-output circuitry 12 includes interface circuitry 26 and memory controller circuitry 28 is merely illustrative. If desired, interface circuitry 26 and memory controller circuitry 28 may be referred to collectively as a memory controller or portions of interface circuitry and memory controller circuitry may be combined. For example, input-output circuitry 12 may include modular input-output circuits that each contain memory controller and interface circuitry and are collectively configured to implement memory controller 28.

Input-output circuitry 12 may be coupled to memory module 22 through paths 34 and 36. During memory read operations, data (DQ) signals and data strobe (DQS) signals may be conveyed from memory module 22 to memory controller circuitry 28 over path 34 and using memory interface circuitry 26. During memory write operations, DQ/DQS may be conveyed from memory controller circuitry 28 to memory module 22 over path 34 and using memory interface circuitry 26.

During read and write operations, control signals such as clock CLKM, address ADDR, and memory command CMDM signals may be conveyed from memory controller circuitry 28 to memory module 22 over path 36. The timing of the control signals may be controlled by timing control circuitry within memory controller circuitry 28 of input-output circuitry 12.

Signal CLKM may serve as a memory reference clock (e.g., a reference clock to which the DQS signals, address signal ADDR, and command signal CMD should be aligned). Memory command CMDM may be configured to a first value to initiate a read operation, to a second value to initiate a write operation, to a third value during normal operation, and to other values to initiate any desired operations. Signal ADDR specifies the address (e.g., a selected bank address in a memory device) from which data is read out during read operations and the address to which data is written during write operations.

Device 10 may include clock generation circuitry 30 that generates clock signals such as controller clock signal CLKC and memory clock signal CLKM and provides the clock signals over clock paths 32. Controller clock signal CLKC may be used to control communications between memory controller 28 and on-chip logic circuitry 18. Memory clock signal CLKM may be provided to memory module 22 using input-output circuitry 12 and may be used in interfacing with memory module 22.

Memory such as memory module 22 often operates at high clock speeds such as 800 MHz or 1600 MHz. It can be challenging for on-chip circuitry such as programmable logic 18 that operates at somewhat reduced speeds (e.g., 200 MHz, 400 MHz, etc.) to perform memory accesses at the high speeds of the memory. Memory controller 28 and interface circuitry 26 may be operated in modes such as quarter rate or half rate modes to accommodate differences operating speed between on-chip circuitry and memory.

In half rate mode, the bit-width of data provided by on-chip circuitry to memory controller 28 (e.g., over paths 40) may be quadrupled relative to the bit-width of data provided by interface circuitry 26 to external memory (e.g., over paths 34). By multiplying the bit-width by four, the on-chip circuitry may be operated at half of the memory clock rate while maintaining overall data throughput between the on-chip circuitry and the external memory. Similarly, in quarter rate mode, the on-chip system clock speed may be a quarter of the memory clock speed and the data width between on-chip circuitry and interface circuitry 26 may be eight times the data width between memory controller 28 and the external memory.

The arrangement of FIG. 2 is merely illustrative and is not intended to limit the scope of the present invention. Integrated circuits other than programmable integrated circuits may similarly include input-output circuitry 12 having memory controller circuitry that is used to communicate with one or more memory modules 22.

Figure 3:
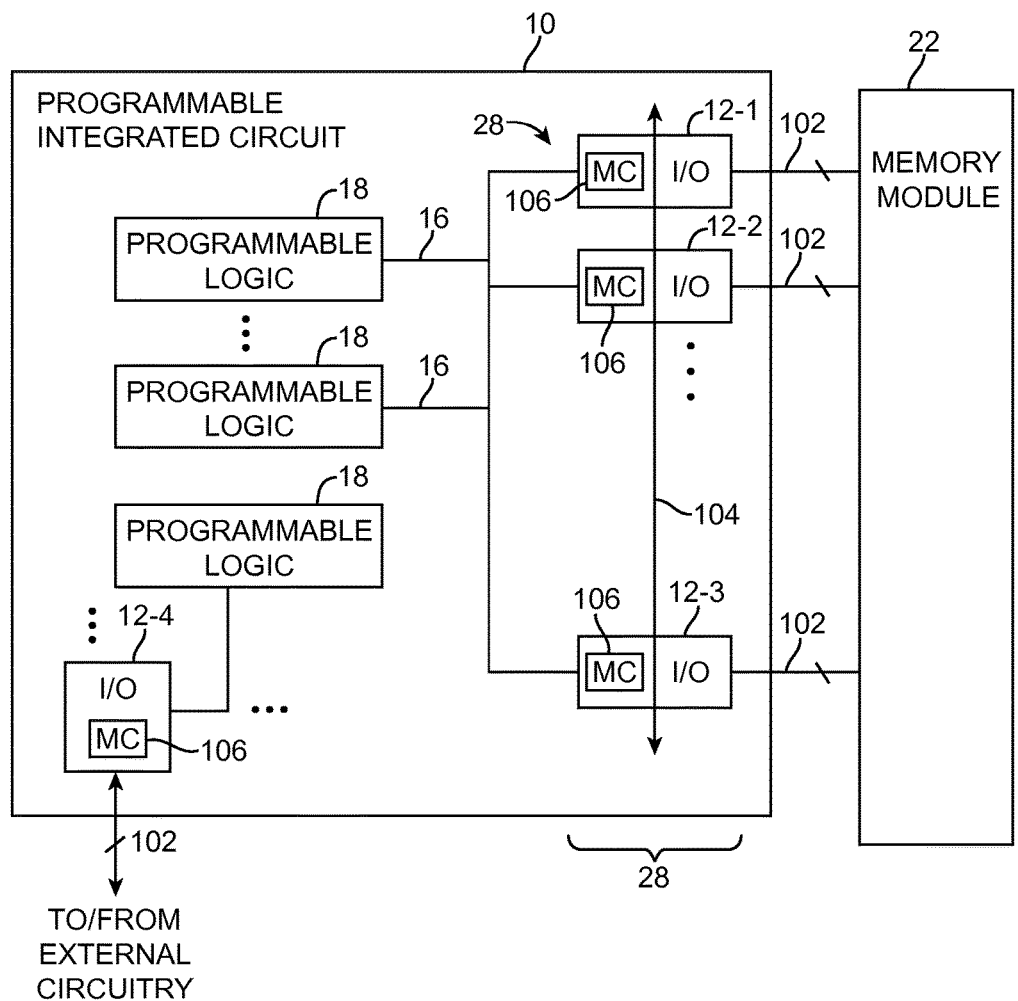
FIG. 3 is a diagram of an illustrative integrated circuit with input-output circuits having dedicated memory controller circuitry that may be used in communicating with external memory in accordance with an embodiment of the present invention.

Paths such as paths 40 of FIG. 2 that are used to route signals such as memory access requests between memory controller 28 and logic circuits 18 can occupy valuable circuit area on programmable integrated circuit 10. FIG. 3 is a diagram of a programmable integrated circuit 10 in which input-output circuits 12 are each provided with dedicated memory controller circuits 106. The modular distribution of memory controller circuitry within input-output circuits 12 may help to reduce area occupied by signal routing paths.

I/O circuits 12 may each handle a set of input-output signals between programmable integrated circuit 10 and external circuitry. I/O circuits 12 may be configured (e.g., programmed in a first configuration) to drive paths 102 with input-output signals provided by programmable logic 18 or may be configured to serve as modular memory controller circuit blocks (e.g., in a second configuration).

In the example of FIG. 3, I/O circuits 12-1, 12-2, and 12-3 are configured to interface between programmable integrated circuit 10 and memory module 22. The set of input-output signals for a given I/O circuit 12 may be conveyed to memory module 22 over a corresponding set of paths 102 (e.g., paths including input-output pins such as pins 14 of FIG. 1). Each set of paths 102 that couples a respective I/O circuit 12 to memory module 22 may have a bit width corresponding to the maximum bit width of input-output signals conveyed over that set of paths. As an example, each set of paths 102 may have a width of twelve bits. This example is merely illustrative, as each set of paths 102 may have any desired bit width (e.g., four bits, eight bits, nine bits, 12 bits, 16 bits, etc.).

Each of memory controller circuits 106 may be capable of handling memory controller operations for a corresponding set of control and/or data signals between programmable integrated circuit 10 and memory 22. Memory access signals provided by programmable logic 18 over programmable interconnects 16 may be partitioned among the input-output circuits that have been configured to serve as memory controller blocks. As an example, control signals may be provided to memory controller block 12-1, whereas write and read data signals may be conveyed over memory controller blocks 12-2 and 12-3. As another example, control signals may be provided to memory controller block 12-2, whereas data signals may be conveyed over memory controller blocks 12-1 and 12-3. These examples are merely illustrative. Any desired number of I/O circuits 12 may be configured as memory controller blocks (e.g., one, two, three, four, or more), and any desired portion of the configured memory controller blocks may be used in handling control or data signals. Memory controller blocks that are in use may collectively form a memory controller such as controller 28 of FIG. 2. In other words, circuitry of memory controller 28 may be partitioned among multiple I/O circuits 12.

The number of memory controller blocks configured may be determined based on how many control and data signals are required (e.g., the width of data paths 102 coupled to the memory controller blocks may correspond to the width of the control and data signals). For example, a sufficient number of memory controller blocks may be configured to convey control signals such as address, command, and clock signals. Similarly, a sufficient number of memory controller blocks may be configured to handle data signals such as read and write signals.

I/O circuits 12 may be coupled by a control signal backbone path 104. Control signal path 104 may electrically couple a group of I/O circuits 12 that functions collectively as a memory controller. In the example of FIG. 3, control signal path 104 couples I/O circuits 12-1, 12-2, and 12-3 to form memory controller 28, whereas I/O circuit 12-4 remains isolated and therefore does not form part of memory controller 28. Control signals such as local or memory control signals may be conveyed between controller blocks using backbone path 104. Use of local backbone path 104 allows flexibility in routing signals from programmable logic 18 to I/O blocks 12 over interconnects 16, because it is not necessary to route control signals to each distributed memory controller block (e.g., thereby also reducing the number of interconnects 16 and associated circuit area that is needed to handle memory controller and I/O operations).

Multiple programmable logic regions 18 may be coupled to memory controller 28 via different or shared paths 16. For example, interconnects 16 may form a bus to which multiple programmable logic regions 18 are coupled. Each programmable logic region 18 may provide memory access requests to memory controller 28 over paths 16. If desired, only one programmable logic region 18 may be coupled to memory controller 28 via paths 16.

I/O circuits 12 may be configured based on desired functionality. In the example of FIG. 3, I/O circuit 12-4 is configured to interface between integrated circuit 10 and external circuitry. The external circuitry may include external communications circuitry, peripheral devices, or other external circuitry or devices. I/O circuit 12-4 may receive signals from a corresponding programmable logic region 18 and drive the signals onto paths 102. I/O circuit 12-4 may receive signals from the external circuitry and provide the received signals to the programmable logic region. In this scenario, memory controller circuitry 28 of I/O circuit 12-4 may remain unused, as I/O circuit 12-4 is not used to interface with external memory.

The example of FIG. 3 in which interconnect backbone 104 traverses I/O circuits 12-1, 12-2, and 12-3 is merely illustrative. If desired, interconnect backbone path 104 may traverse any desired number of I/O circuits 12. For example, backbone path 104 may traverse I/O block 12-4. Backbone path 104 may traverse some or all of I/O circuits 12 on programmable integrated circuit 10. If desired, groups of two or more I/O circuits 12 may be organized with a backbone path 104 traversing the I/O circuits of each group. Each backbone path 104 may be configured to electrically couple some or all of the I/O circuits that are traversed by that backbone path to form memory controllers. I/O circuits that are not coupled to other I/O circuits via a backbone path 104 may operate as independent memory controllers or may operate as a direct signal interface between on-chip logic such as logic regions 18 and off-chip circuitry (e.g., the I/O circuits may pass signals between the on-chip logic and the off-chip circuitry).

It can sometimes be challenging to operate memory controllers such as centralized or modular memory controller circuitry at different clock speeds than external memory (e.g., in half rate or quarter rate modes). For example, some integrated circuits may require error checking information to be transmitted along with memory write data. Error checking may be desirable in performing error-sensitive functions or in high-speed applications such as network communications (e.g., Ethernet). Error checking information may include cyclic redundancy check (CRC) bits that are generated from data and transmitted to memory along with the data (e.g., over paths 34). Error checking information such as CRC bits may be transmitted at the end of a burst memory access and may introduce additional memory clock cycles that can potentially disrupt the balance between controller operations and memory operations.

Figure 4:
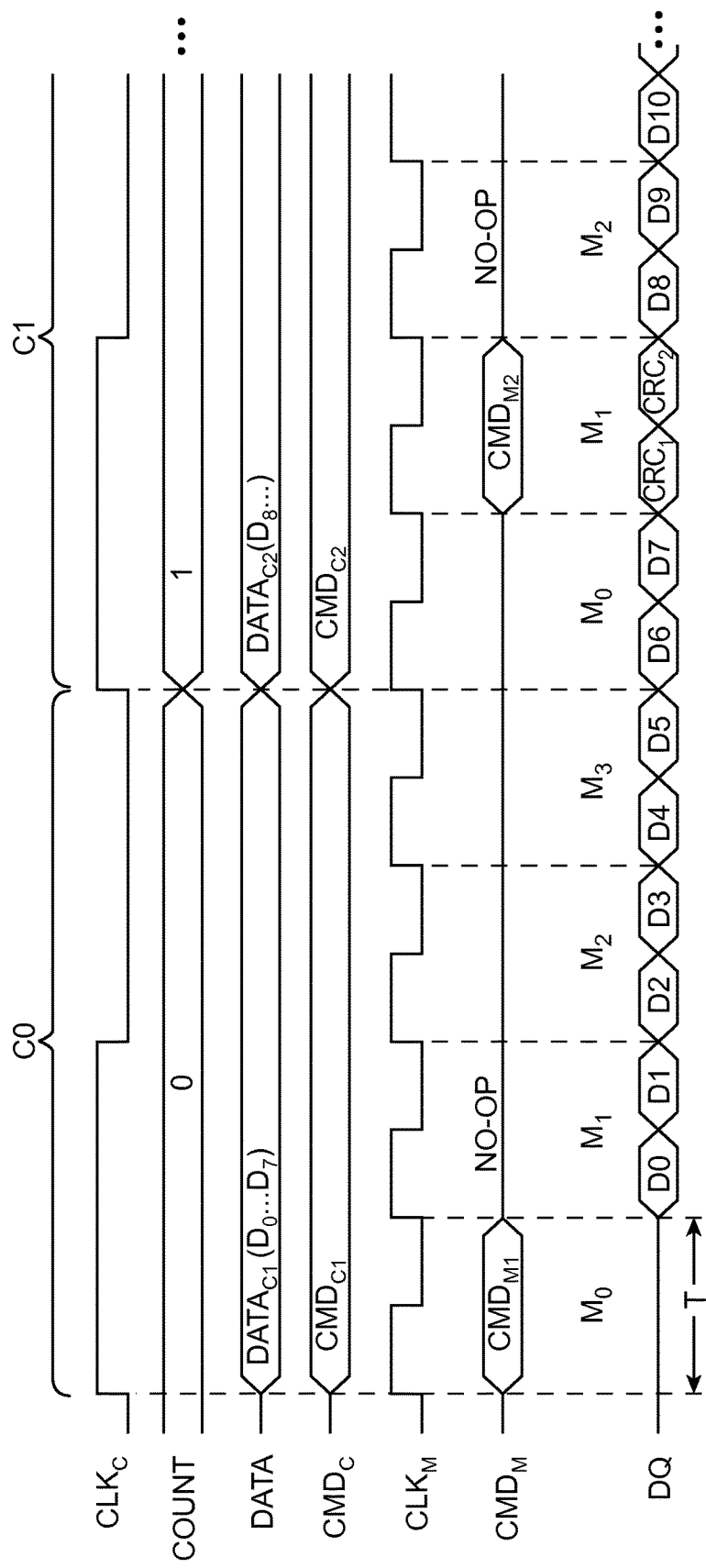
FIG. 4 is a timing diagram showing how an integrated circuit may assign time slots to memory commands in accordance with an embodiment of the present invention.

Memory controller circuitry 28 and interface circuitry 26 may partition each controller clock cycle into multiple memory clock cycles that are each assigned to associated time slots. Time slot information may be used in accommodating mismatches between memory controller clock cycles and memory clock cycles (e.g., mismatch resulting from error checking operations). FIG. 4 is an illustrative timing diagram showing how memory controller 28 and memory interface circuitry 26 may use time slot partitioning of controller clock cycles to handle mismatch between controller and memory clocks. In the example of FIG. 4, memory controller 28 may be operated in a quarter rate mode in which each controller clock cycle (e.g., C0 or C1) is partitioned into four memory clock cycles (i.e., M0, M1, M2, and M3). However, this example is merely illustrative. Memory controller may partition controller clock cycles into any desired number of memory clock cycles such as based on the ratio between the memory controller clock frequency and the memory clock frequency.

During controller clock cycle C0, memory controller 28 may receive a memory write request from on-chip circuitry such as logic circuits 18. The memory access request received during controller clock cycle C0 may include a controller command CMDC1 and data DATAC1 to be written to memory. Controller command CMDC1 may include information identifying the write request and address information identifying a location within memory 22 to which data should be written. Data DATAC1 may include portions D0, D1, . . . , D7 each having bit widths corresponding to the bit-width of data paths 34 between memory 22 and device 10. This example is merely illustrative. Data DATAC1 may include any desired number of portions and the number of portions may sometimes be referred to as a burst length.

Memory controller 28 may generate memory command signals CMDM1 based on controller command CMDC1. Memory command signals may include a row access strobe (RAS), a column access strobe (CAS), address signals, chip select (CS), or any desired memory control signals that control memory 22 to fulfill the memory access request. At memory clock cycle M0 of controller cycle C0, controller 28 may provide controller command CMDM1 to memory 22 (e.g., using interface circuitry 26). Data portions D0-D7 may be delayed by a predetermined time T based on memory specifications or requirements. In the example of FIG. 4, data portions D0-D7 may be provided to memory module 22 during clock cycles M1, M2, M3, and a subsequent memory clock cycle M0 associated with controller clock cycle C1. In other words, data portions D0-D7 may be delayed by time T relative to memory command CMDM1. Time T may be one memory clock cycle as shown in FIG. 4 or may be any required number of memory clock cycles such as one, two, three, four, or more memory clock cycles. For example, time T may be eight memory clock cycles.

Controller 28 may generate error checking data CRC1 and CRC2 from data DATAC1 that are transmitted to memory 22. Memory 22 may use the error checking data in verifying the integrity of data portions D0 . . . D7 received from memory controller 28. Fulfillment of memory command CMDM1 using memory 22 may require a number of memory clock cycles that extends into controller clock cycle C1, because each memory command requires transfer of data (e.g., write and error checking data) that occupies five memory clock cycles, which is greater than the number of memory clock cycles associated with each controller clock cycle. However, memory controller 28 may receive an additional memory write access command CMDC2 with data DATAC2 during controller clock cycle C1. Controller 28 may be unable to provide corresponding memory command CMDM2 to memory during time slot M0, because the memory command would interfere with fulfillment of the previous memory command (CMDM1). Controller 28 may determine that memory command CMDM2 and corresponding data should be transmitted to memory during time slot M1 of controller clock cycle C1 to avoid conflicts with previous memory command CMDM1.

Controller 28 may maintain phase information that is used in determining which time slot of any controller clock cycle is assigned to each memory access request (e.g., the first available time slot for transmitting memory commands in fulfilling the memory access request). The phase information may be maintained as a counter value and may represent a location in time within a controller clock cycle. The counter value may be incremented modulo the number of time slots per controller clock cycle. In the example of FIG. 4, counter values 0, 1, 2, and 3 may correspond to respective time slots M0, M1, M2, and M3 and incrementing counter value 3 may wrap to 0. Counter value COUNT may be initiated to zero. During controller clock cycle C0, the controller may issue controller command CMDM1 in time slot M0 corresponding to counter value 0. At controller cycle C1, controller 28 may increment the value of COUNT from 0 to 1. Memory access operations for controller command CMDC2 received during controller cycle C1 may therefore be issued during time slot M1 associated with count value 1. By incrementing the value of COUNT, memory controller 18 may accommodate the transfer of error checking data while helping to ensure efficient fulfillment of memory access requests (e.g., because there is no gap between transfer of error checking data for a previous memory access request and transfer of memory command signals for a subsequent memory access request).

The example of FIG. 4 in which the counter value is incremented by one is merely illustrative. If desired, the counter value may be incremented by any desired value such as a value corresponding to how many memory clock cycles are needed to transmit error checking data (e.g., how many memory clock cycles of the current controller clock cycle are required to fulfill memory commands in a previous controller clock cycle). Error checking data may, for example, be generated in a DDR4 memory controller configuration. In general, the counter value may be incremented by an amount determined based on the number of memory clock cycles required to fulfill memory access requests. For example, in a DDR4 memory controller mode in which error checking is disabled, the number of memory clock cycles required to fulfill a memory access request may match the number of memory clock cycles in each controller clock cycle. In this scenario, the counter value may be fixed at zero, because there is no mismatch between controller and memory clock cycles. In general, the counter value may be fixed at zero for memory controller modes in which memory clock cycles match controller clock cycles (e.g., for a DDR3 memory controller mode in which error checking data is omitted and therefore not produced or used).

Controller 28 may increment counter value COUNT at every controller clock cycle. For example, a counter circuit at controller 28 may increment counter value COUNT each controller clock cycle. Alternatively, counter value count may be incremented for each controller command that is fulfilled by controller 28 (e.g., the counter may be incremented in response to fulfillment of controller command CMDC1, in response to controller command CMDC2, etc.).

Figure 5:
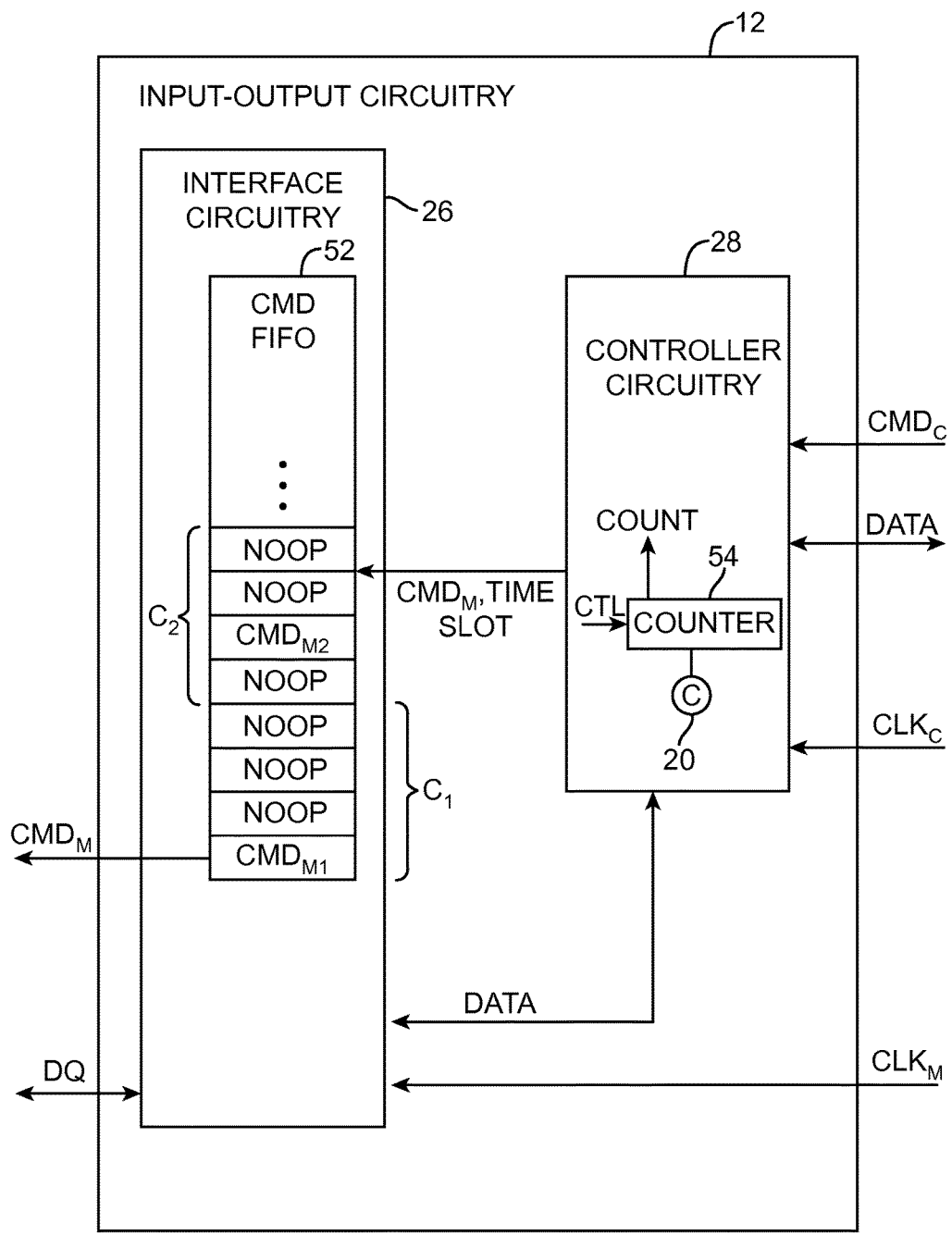
FIG. 5 is a diagram of illustrative input-output circuitry having controller circuitry and interface circuitry operable to communicate with an external memory module in accordance with an embodiment of the present invention.

FIG. 5 is an illustrative diagram of input-output circuitry 12 that may handle mismatch between controller and memory clock cycles by maintaining time slot state information. As shown in FIG. 5, input-output circuitry 12 includes memory controller circuitry 28 that may receive memory access requests in the form of controller commands (CMDC) and data from circuitry such as logic circuits 18 of FIG. 3.

Memory controller circuitry 28 may include a counter 54 that produces a counter value such as COUNT of FIG. 4 that is used in determining which time slot of a controller clock cycle should be used in initiating memory access operations for the memory access requests. The counter may be configured via one or more programmable elements 20. For example, programmable element 20 may be loaded with a first static configuration value that configures counter 54 as a free-reigning counter. As another example, programmable element 20 may be loaded with a second static configuration value that configures counter 54 to increment in response to receiving and/or processing a memory access request. If desired, memory controller circuitry 28 may control the operations of counter 54 via control signal CTL (e.g., provided in addition to or replacing the static control signals of programmable element 20).

Controller circuitry 28 may generate memory commands CMDM and a time slot assignment for each memory access request and provide the generated signals to interface circuitry 26. Interface circuitry 26 may include a command first-in-first-out (FIFO) buffer 52 having entries in which memory commands CMDM are stored. During each memory clock cycle CLKM, the memory command stored in the earliest entry of CMD FIFO buffer 52 may be issued to system memory along with a corresponding data portion (e.g., a portion of data received from memory controller circuitry may be transmitted over DQ paths). No-operation (NOOP) commands may be stored in unused entries (i.e., entries of FIFO buffer 52 that are not used to store memory commands generated from memory access requests). In the scenario of FIGS. 4 and 5, memory command CMDM1 and three subsequent no operation (NOOP) commands may be stored for controller cycle C1, whereas a NOOP command followed by CMDM2 and two NOOP commands may be stored for controller cycle C2.

If desired, time slot assignments may be predetermined at memory controller circuitry 28 and the sequence of commands for the time slots of any given controller clock cycle may be stored as a group in command FIFO 52 by memory controller circuitry 28. In this scenario, the time slot assignment may be encoded into the sequence of commands. For example, a first sequence (CMDM1, NOOP, NOOP, NOOP) may be provided by controller 28 to CMD FIFO 52 for controller cycle C1, whereas a second sequence (NOOP, CMDM2, NOOP, NOOP) may be stored for controller cycle C2. Each sequence may be transmitted from memory controller circuitry 28 to interface circuitry 26 at a respective controller clock cycle of clock CLKC (e.g., each sequence may be transmitted as a block of data at the rising edge of controller clock signal CLKC).

Figure 6:
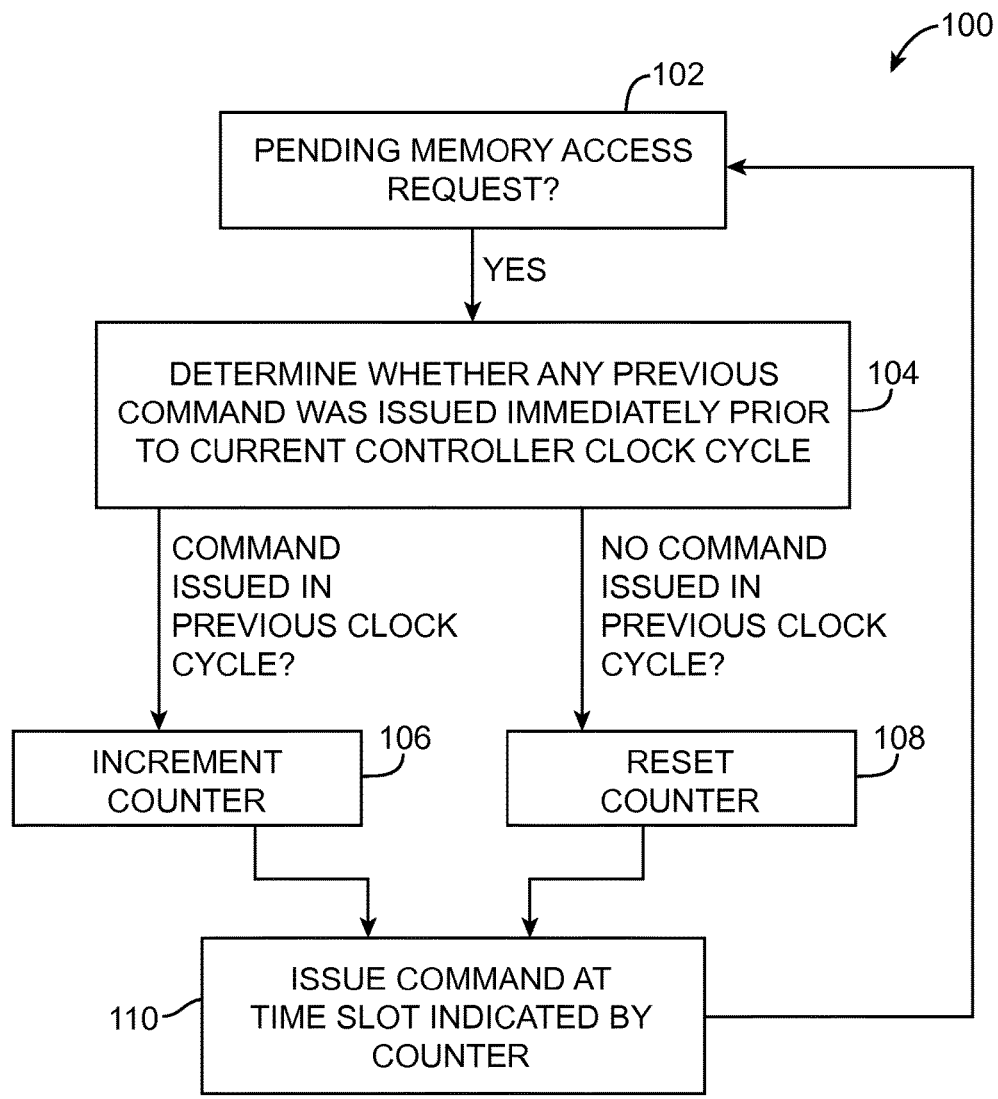
FIG. 6 is a flow chart of illustrative steps that may be performed by memory controller circuitry to assign time slots to memory commands in fulfilling memory access requests in accordance with an embodiment of the present invention.

If desired, memory controller circuitry 28 may perform active control of counter 54 using control signal CTL. FIG. 6 is a flow chart 100 of illustrative steps that may be performed by a memory controller using memory controller circuitry and interface circuitry in fulfilling memory access requests while actively controlling the operations of a counter to assign time slots to memory commands. The operations of flow chart 100 may be performed to select memory clock cycles for memory commands that avoid conflicts between the memory commands and any previously issued memory commands.

During step 102, the memory controller may determine whether any memory access requests are pending. In other words, the memory controller may determine whether any memory access requests have been received but not yet processed by sending memory commands to interface circuitry. In response to determining that there are pending memory access requests, the operations of step 104 may be performed.

During step 104, the memory controller may determine whether any previous command was issued immediately prior to the current controller clock cycle (i.e., in the controller clock cycle immediately preceding the current controller cycle). For example, during clock cycle C1 of FIG. 4, memory controller 28 may determine that command CMDC1 was processed and issued during preceding clock cycle C0. In response to determining that a previous command was issued immediately prior to the current controller clock cycle, the operations of step 106 may be performed to increment a counter value. In response to determining that no commands were issued immediately prior to the current controller clock cycle, the operations of step 108 may be performed to reset the counter value (e.g., reset to zero). By resetting the counter value, latency of processing memory access requests may be improved, because pending memory access requests are issued at the first available memory clock cycle.

During step 110, the memory controller may generate and issue a memory command for the pending memory access request at a time slot corresponding to the counter value. By selecting a time slot based on the counter value, the memory controller may avoid conflicts between any previously issued memory commands and the current generated memory command. The process may subsequently return to step 102 to process additional pending memory access requests.

Figure 7:
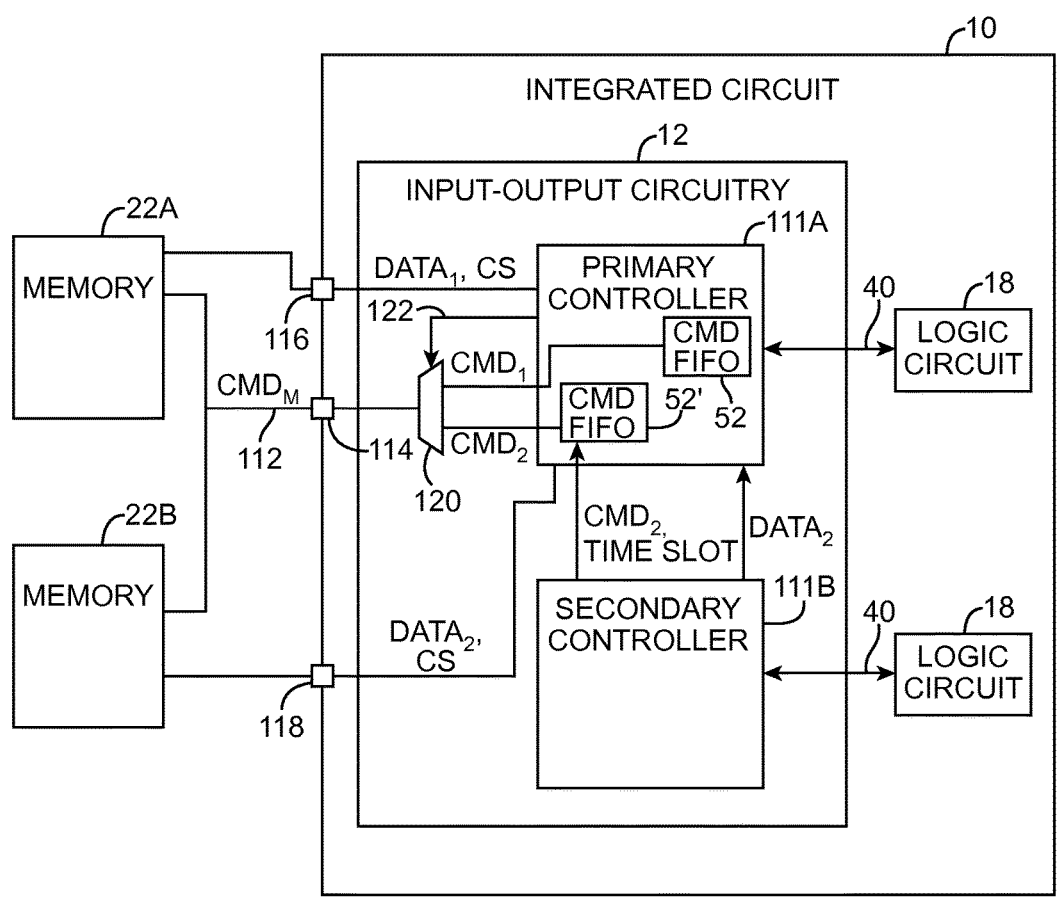
FIG. 7 is a diagram of an illustrative integrated circuit that communicates with external memory modules using primary and secondary controllers in accordance with an embodiment of the present invention.

The number of input-output pins such as pins 14 of FIG. 1 available for conveying memory control and data signals may be subject to limitations and constraints. For example, the number of input-output pins may be constrained by the available integrated circuit area. Input-output pin constraints can be exacerbated in scenarios such as when multiple memories are coupled to integrated circuit 10. FIG. 7 is a diagram of an illustrative integrated circuit 10 that is coupled to memory modules 22A and 22B. Input-output circuitry 12 may include controllers 111A and 111B that receive and fulfill memory access requests from logic circuits 18. Controller 111A may fulfill memory access requests using memory 22A, whereas controller 111B may fulfill memory access requests using memory 22B. Controllers 111A and 111B of FIG. 7 may include interface circuitry and memory controller circuitry such as circuitry 26 and 28 of FIG. 5.

As shown in FIG. 7, memory command signals CMDM provided to memory modules 22A and 22B may be provided over a shared path 112. In other words, memory command signals for memory modules 22A and 22B may be transmitted from a shared set 114 of input-output pins. Input-output pins 114 may sometimes be referred to herein as command pins, because pins 114 are used to convey memory command signals. Sets 116 and 118 of input-output pins may be used to convey data signals and, if desired, additional control signals such as chip select signals CS. Use of shared input-output pins for multiple memory modules helps to conserve limited input-output resources.

Each memory module may be controlled by a respective controller 111. To accommodate independent control of memory modules 22A and 22B while using shared command pins, controller 111A may be designated as a primary controller, whereas controller 111B may be designated as a secondary controller. Memory commands CMD1 generated by primary controller 111A for memory 22A may be stored in command FIFO 52 and may be sometimes referred to herein as primary memory commands. Memory commands CMD2 generated by secondary controller 111B for memory 22B may be stored in command FIFO 52' and may be sometimes referred to herein as secondary memory commands. Secondary controller 111B may provide memory commands CMD2 for memory module 22B along with corresponding phase information such as a time slot to primary controller 111A. Secondary memory commands CMD2 may be generated to satisfy command latency requirements similarly as memory controller circuitry 28 of FIG. 5. The phase information provided by secondary controller 111B may, for example, include counter values that identify time slot assignments for the memory commands.

Primary controller 111A may generate memory commands CMD1 for memory 22A based on requests received from logic circuit 18 over corresponding path 40. Primary controller 111A may compare the phase information of memory commands CMD1 with the phase information of memory commands CMD2 to ensure that memory commands issued over shared paths 112 are not conflicting (e.g., to ensure that the time slot of valid memory commands CMD1 for memory 22A are not the same as the time slot of valid memory commands CMD2 for memory 22B). Multiplexer 120 may receive memory commands CMD1 and CMD2 from primary controller 111A and receive control signals from primary controller 111A over path 122. Primary controller 111A may control multiplexer 120 to issue memory commands for memory 22A by routing command signals CMD1 from command FIFO 52. Similarly, primary controller 111A may control multiplexer 120 to issue memory commands for memory 22B by routing command signals CMD2 from command FIFO 52'.

During times in which valid memory commands CMD1 are provided over shared paths 112 to memory 22A, a chip select (CS) signal provided to memory 22A over pins 116 may be asserted, whereas a chip select (CS) signal provided to memory 22B over pins 118 may be de-asserted. The chip select signals may enable commands for memory 22A and disable commands for memory 22B so that valid memory commands CMD1 and data DATA1 are only processed by memory 22A. Similarly, during times in which valid memory commands CMD2 and data DATA2 are provided over shared paths 112 to memory 22B, chip select signals may be used in enabling memory 22B and disabling memory 22A. Arrangements such as shown in FIG. 7 in which commands from multiple controllers are provided from shared command pins may sometimes be referred to as a ping-pong configuration.

Figure 8:
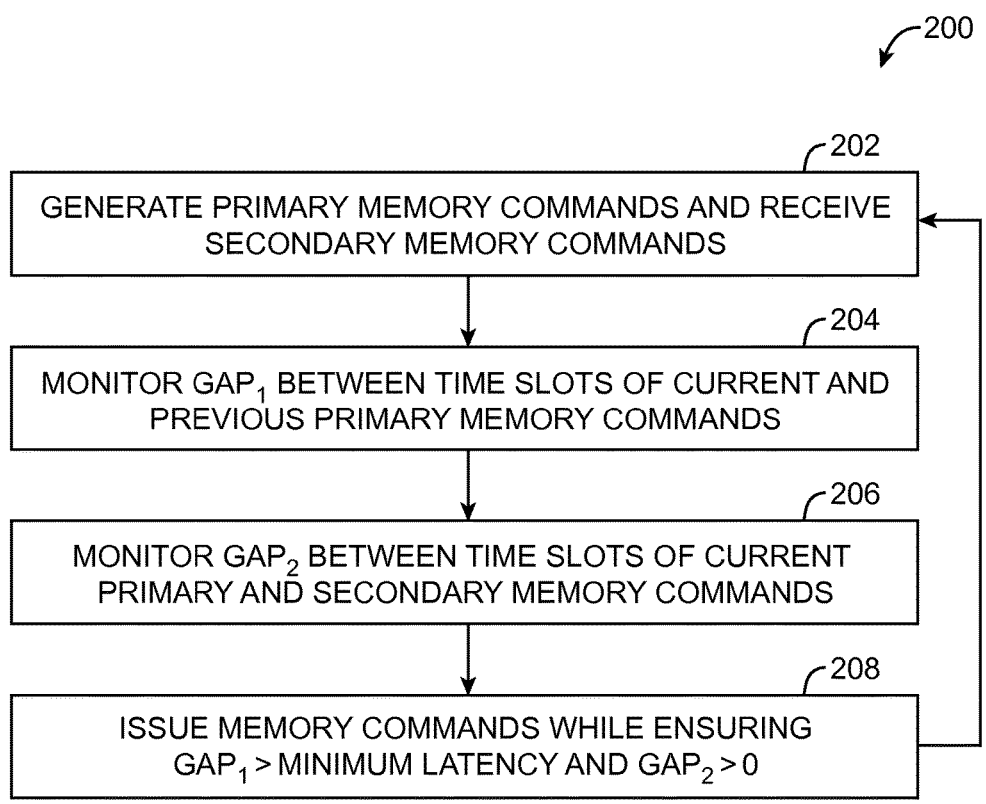
FIG. 8 is a flow chart of illustrative steps that may be performed by a primary controller to selectively delay memory commands in order to prevent conflicts with a secondary controller in accordance with an embodiment of the present invention.

FIG. 8 is a flow chart 200 of illustrative steps that may be performed by a primary controller coupled to a secondary controller in providing memory commands to multiple memory modules over shared paths. For example, the operations of flow chart 200 may be performed by primary controller 111A of FIG. 7 that is coupled to secondary controller 111B.

During step 202, the primary controller may generate primary memory commands and receive secondary memory commands. For example, primary memory commands CMD1 of FIG. 7 may be generated and stored in command FIFO 52, whereas secondary memory commands generated by secondary controller 111B may be received and stored in command FIFO 52'.

During step 204, the primary controller may monitor a first gap (GAP1) between the time slot of a currently pending primary memory command and the time slot of the previously issued primary memory command. The gap may represent the number of memory clock cycles between issuing the previous primary memory command and the time slot assigned to the currently pending primary memory command. The current primary command time slot may be identified from the time slot of a pending memory command CMD1, whereas the time slot of the previously issued command may correspond to the time slot of a previously issued memory command CMD1.

During step 206, the primary controller may monitor a second gap (GAP2) between the time slot of the currently pending primary memory command and the time slot of the currently pending secondary memory command. For example, the primary controller may determine how many memory clock cycles separate the time slots of the currently pending primary and secondary memory commands. The current secondary command time slot may be identified from time slot information that was received from the secondary controller along with the current pending secondary memory command.

During step 208, the primary controller may issue memory commands while ensuring that the first gap satisfies minimum command latency requirements and while ensuring that the second gap is greater than zero. The minimum command latency requirements may be defined by the number of memory clock cycles required to fulfill memory command using memory (e.g., including memory cycles for data transfer and error checking data transfer).

If the first gap fails to satisfy minimum command latency requirements, the primary controller may delay the currently pending primary memory command until the command latency requirements are satisfied. By ensuring that the gap between current and previous primary memory commands satisfies the minimum command latency requirements, the primary controller may help to prevent conflicts between current and previous primary memory commands. Conflicts between current and previous secondary memory commands may be resolved locally at secondary controller 111B (e.g., prior to providing secondary memory commands to primary controller 111A).

If the second gap is equal to zero (i.e., the currently pending primary and secondary memory commands are each assigned the same time slot), the primary controller may prioritize issuance of a selected one of the primary and secondary memory commands and delay issuance of the non-selected memory command. For example, primary commands may be prioritized over secondary commands. As another example, secondary commands may be prioritized over primary commands. By ensuring that primary and secondary memory commands are not issued at the same time slot of any given controller clock cycle, the primary controller may help to prevent conflicts on shared path 112 between primary and secondary memory commands.

The example of FIG. 8 in which steps 202-208 are performed sequentially is merely illustrative. If desired, portions or all of steps 202-208 may be performed in parallel. For example, memory commands may be generated and received by the primary controller during step 202 independently of monitoring operations of steps 204 and 206 and command issuance operations of step 208.

Figure 9:
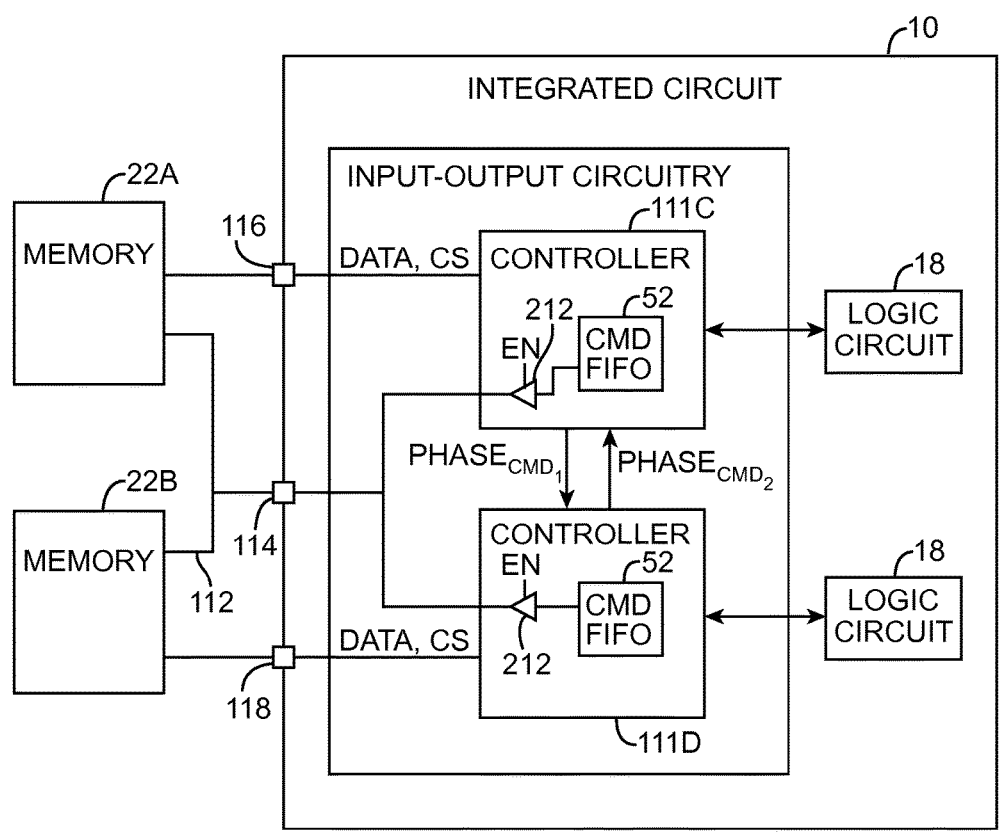
FIG. 9 is a diagram of an illustrative integrated circuit having multiple controllers that each operates to prevent conflicts at shared command pins in accordance with an embodiment of the present invention.

If desired, responsibility for resolving conflicts may be assigned to each controller. FIG. 9 is a diagram of an illustrative device 10 in which controllers 111C and 111D exchange phase information to be used in resolving conflicts on shared command paths 112. As shown in FIG. 9, controllers 111C and 111D may each have a command FIFO 52 in which pending memory commands are stored. Each pending memory command may have associated phase information such as an assigned time slot.

Phase information for pending memory commands may be exchanged between controllers 111C and 111D. Phase information PHASECMD1 for commands generated by controller 111C for memory 22A may be conveyed to controller 111D, whereas phase information PHASECMD2 for commands generated by controller 111D for memory 22B may be conveyed to controller 111C. Each controller may monitor PHASECMD1 and PHASECMD2 to identify potential conflicts. In the event that a conflict is detected (e.g., pending memory commands have been assigned the same time slot), controllers 111C and 111D may selectively enable and disable respective driver circuits 212 using control signals EN. One of controllers 111C and 111D may be initially assigned higher priority or controllers 111C and 111D may communicate to determine which controller has priority in the event that a conflict is detected. Shared responsibility for conflict identification via communications between memory controllers can be especially helpful in modular memory controller designs such as shown in FIG. 3, because each memory controller 106 can be configured to operate independently or with any other memory controller.

The example of FIGS. 7 and 9 in which two controllers use shared command paths to fulfill memory access requests using two external memory modules is merely illustrative. In general, any desired number of controllers may be used in accessing external memory using shared paths. As an example, the controllers may be organized into a primary-secondary arrangement in which one controller serves as a primary controller and the remaining controllers serve as secondary controllers that provide memory commands to the primary controller for conflict resolution. As another example, the controllers may exchange command phase information and may each resolve conflicts based on predetermined priority information or communications between the controllers. If desired, each controller may be configured to increment its time slot assignment for each controller clock cycle with each controller assigned a different starting value (e.g., a first controller is assigned a starting value of zero, a second controller is assigned a starting value of one, etc.). In this scenario, conflicts may be avoided while complexity of time slot assignment circuitry may be reduced.

The foregoing is merely illustrative of the principles of this invention and various modifications can be made by those skilled in the art without departing from the scope and spirit of the invention. The foregoing embodiments may be implemented individually or in any combination.

What is claimed is:

1. A method of using a memory controller that communicates with memory, wherein the memory operates using a memory clock signal having memory clock cycles, the method comprising:
   with controller circuitry in the memory controller, generating a memory command from a pending memory access request using a controller clock signal having controller clock cycles; and
   with the controller circuitry, selecting a memory clock cycle for the memory command that avoids conflicts between the generated memory command and any previously issued memory commands;
   with interface circuitry directly interposed between the controller circuitry and the memory, receiving the memory command and the selected memory clock cycle from the controller circuitry;
   with the interface circuitry, providing the memory command to the memory at the selected memory clock cycle;
   with a counter, producing a counter value;
   while the controller circuitry is operating in a first mode, incrementing the counter value every controller clock cycle; and
   while the controller circuitry is operating in a second mode, keeping counter value fixed at zero.

2. The method defined in claim 1 wherein selecting the memory clock cycle for the memory command that avoids conflicts between the generated memory command and any previously issued memory commands comprises selecting the memory clock cycle based on the counter value.

3. The method defined in claim 2 wherein selecting the memory clock cycle for the memory command that avoids conflicts between the generated memory command and any previously issued memory commands comprises:
   determining whether any memory command was issued immediately prior to a current controller clock cycle; and
   in response to determining that a memory command was issued immediately prior to the current controller clock cycle, incrementing the counter value.

4. The method defined in claim 3 wherein selecting the memory clock cycle for the memory command that avoids conflicts between the generated memory command and any previously issued memory commands further comprises:
   in response to determining that no memory command was issued immediately prior to the current controller clock cycle, resetting the counter value.

5. The method defined in claim 1 wherein each controller clock cycle is associated with a set of memory clock cycles and wherein the selected memory clock cycle is included in the set of memory clock cycles for a current controller clock cycle, the method further comprising:
   generating no-operation memory commands that are assigned to non-selected memory clock cycles of the set of memory clock cycles of the current controller clock cycle.

6. A memory controller comprising:
   a counter that produces a counter value;
   controller circuitry that receives memory access requests and that generates memory commands from the memory access requests and assigns memory clock cycles of a memory clock signal to the memory commands based on the counter value, wherein the memory controller interfaces with memory that operates using the memory clock signal, and wherein the controller circuitry has a first mode in which the counter increments the counter value every controller clock cycle and a second mode in which the counter value is fixed at zero; and
   interface circuitry directly interposed between the controller circuitry and the memory that receives the memory commands and memory clock cycle assignments from the controller circuitry and that issues the memory commands to the memory based on the memory clock cycle assignments.

7. The memory controller defined in claim 6, wherein the memory controller is distributed throughout a plurality of input-output circuits.

8. The memory controller defined in claim 7 wherein the counter increments the counter value every controller clock cycle.

9. The memory controller defined in claim 7, wherein the controller circuitry resets the counter in response to determining that no memory command was issued in a previous clock cycle.

10. The memory controller defined in claim 6 wherein the first mode comprises a DDR4 memory controller mode that produces error checking data and wherein the second mode comprises a DDR3 memory controller mode that omits error checking data.

11. The memory controller defined in claim 6 wherein the memory controller comprises dedicated memory controller circuitry.

* * * * *